United States Patent
Wierzbicki et al.

(10) Patent No.: US 7,969,747 B1
(45) Date of Patent: Jun. 28, 2011

(54) LINE CORD FILTER

(75) Inventors: Robert P. Wierzbicki, Worcester, MA (US); Ralph L. Hill, Hollis, NH (US)

(73) Assignee: EMC Corporation, Hopkinton, MA (US)

( * ) Notice: Subject to any disclaimer, the term of this patent is extended or adjusted under 35 U.S.C. 154(b) by 1294 days.

(21) Appl. No.: 11/540,472

(22) Filed: Sep. 29, 2006

(51) Int. Cl.
*H05K 9/00* (2006.01)

(52) U.S. Cl. ........ 361/816; 439/651; 439/607; 439/608; 439/214; 439/456; 439/457; 439/458

(58) Field of Classification Search .................. 361/816; 439/651, 607, 608, 214, 456–458, 638, 215
See application file for complete search history.

(56) References Cited

U.S. PATENT DOCUMENTS

| | | | | |
|---|---|---|---|---|
| 4,327,246 A * | 4/1982 | Kincaid | ........................... | 174/36 |
| 6,233,158 B1 * | 5/2001 | Leman | ........................... | 361/799 |
| 7,042,720 B1 * | 5/2006 | Konshak et al. | ......... | 361/679.33 |

* cited by examiner

*Primary Examiner* — Tuan T Dinh
*Assistant Examiner* — Abiy Getachew
(74) *Attorney, Agent, or Firm* — Krishnendu Gupta; Jason A. Reyes

(57) ABSTRACT

Apparatus includes a chassis assembly, a computing device configured to connect to a housing of the chassis assembly, and a line cord supplying power to the chassis assembly. The line cord has a first portion external to the chassis assembly and a second portion internal to the chassis assembly. The second portion has a shielding member that is in conductive contact with the housing to provide electromagnetic interference (EMI) shielding for the chassis assembly.

18 Claims, 5 Drawing Sheets

LINE CORD FILTER

FIELD OF THE INVENTION

The present invention relates generally to a line cord filter.

BACKGROUND OF THE INVENTION

Electromagnetic interference (EMI) is created from everyday natural sources. Additionally there are innumerable sources of man made EMI typically created and radiated by televisions, power transmission lines, ignition systems, fluorescent lightning, radar transmissions, electric car chargers, and computing devices. These sources of EMI radiation challenge the equipment, designers, and engineers to find a solution to keep electronic signals coming to equipment clean and usable, isolated from the negative effects of the ever present EMI.

EMI filters, which are electronic devices having suitable capacitive and inductive characteristics for reducing the onerous EMI, are commonly installed in electronic circuits to achieve this goal.

Filters for the application of interest here are commonly fabricated by prior art methods and typically consist of a discoidal capacitor, feed through filter in a bulk head mount configuration that is placed in a signal path to redirect electromagnetic interference back to its source.

Feed through filters of this type consist of either a capacitor (C-only) or a combination of capacitive and inductive elements arranged in classic filter configurations (LC, Pi, or T). Each of these configurations fits a particular application requirement. The most economical solution is to select the filter with the fewest internal parts that achieves the desired filtering effect.

C-only filters, i.e., filters that consist solely of capacitive elements, can be well-suited for filtering high frequency signals on lines with very high impedance. In at least some practical cases, the attenuation of these devices increases in steps of 20 dB per decade from the filter's cutoff frequency up to the frequency where they reach an attenuation of at least 60 dB. (There are many C filters that provide less performance in practical applications. Many physically-realizable filters cannot achieve 60 dB attenuation.)

The LC type filter can be well-suited for applications in which there are large differences between line and load impedances. (Note that effective LC filters can also be built where both source and load impedances are identical.) These devices consist of a capacitive element, in the same manner as the C-only filter, with the addition of an inductive element connected in series with the capacitor between the input and output terminals. Usually, it is best to install the filter so that the inductive element faces the lower impedance terminal. With respect to the conventional packaging of discoidal capacitor type filters, this means that in some applications it is desirable to have the capacitive element close to the threaded or screw-neck header end of the filter package, while in other cases the reverse is desirable, with the inductive element located on the threaded or screw-neck end.

Unlike conventional leaded capacitors, the discoidal capacitor's co-axial configuration provides at least two advantages. It prevents radiation present at the input end from coupling directly to the capacitor output. This construction also has inherently low self- and mutual inductance and the combination provides excellent shunting of EMI at frequencies approaching 1 GHz. The addition of inductive elements (wire wound coils, toroids or beads) in series with the capacitor increases the impedance of the line, making the filter even more effective.

Pi filters consist of three elements. A series inductive element is positioned between two capacitors which are shunt connected one across the source and one across the load. Pi filters are well-suited for applications where the input and the output impedances are of relatively high value and high levels of attenuation are required. In at least some practical cases, these filters may increase attenuation by 60 dB per decade from the filter cutoff frequency to the frequency where the filter exhibits an attenuation of at least 80 dB. (The capacitors in a Pi filter work by providing a large impedance mismatch relative to the (higher) source and load impedance in the application circuit. There is no requirement that the source and load impedances be similar for a Pi filter to function effectively. Note also that 80 dB attenuation is not an intrinsic property of a Pi filter; many physically realizable filters do not achieve an attenuation approaching 80 dB.)

The T filter is also a three-element device, but this time there are two series inductors connected between the input and output terminals on each side of a single capacitor which is shunt connected across the signal and its return conductors. In at least some practical cases, the T filter performs in much the same manner as a Pi filter, increasing attenuation in steps of 60 dB per decade from the cutoff frequency to the frequency where the attenuation is at least 60 dB. This filter type is selected when both the input and output impedances are low.

Internally the most complicated device, the LL filter consists of two feed through capacitors connected between line and ground interspersed with two inductors connected in series between the input and output terminals. In at least some practical cases, these filters increase in attenuation in steps of 80 dB per decade from the cutoff frequency to the frequency where the attenuation is at least 80 dB. (Note also that 80 dB attenuation is not an intrinsic property of an LL filter; many physically realizable filters do not achieve an attenuation approaching 80 dB.)

Today, most center through-feed, metal enclosure, metal housing, bulkhead or through hole mounted EMI filters for low frequency, high current applications employ at least one discoidal capacitor element, and commonly use X7R ceramic formulations for the capacitor dielectric. It can be cost-effective and has an adequate dielectric constant at normal operating temperatures.

In particular, at least one type of C-only feed through filter uses a feed through capacitor that mounts into an opening of an enclosure wall and is secured by soldering or mechanical means. A conductor passes through the center of the capacitor and the electrical signal is filtered by the capacitor. The noise currents are shunted to the enclosure through the dielectric material of the feed through capacitor. If multiple conductors are needed, multiple feed through capacitors are used.

In one or more enclosures, a typical data storage system includes data moving circuitry and an array of disk drives. Some data storage systems fit within standard-sized equipment cabinets or racks. The data moving circuitry for such data storage systems is typically fashioned into modules called blade servers, or simply blades, which are housed (perhaps in pairs) within enclosures. Such enclosures are commonly available in a variety of standard heights (e.g., 4 U, 3 U, 2 U and 1 U, where U is a standard measure of vertical height in the equipment cabinet and is equal to 1.75 inches in accordance with the EIA-310-D industry standard).

One conventional enclosure (hereinafter referred to as the conventional 4 U enclosure) includes a 4 U chassis, a midplane, two independent blades, two dual-port power supplies, and three pairs of fans. The midplane sits in the middle of the 4 U chassis. The two blades independently plug into the midplane through a rear opening of the 4 U chassis and reside in a stacked manner within the 4 U chassis, one above the other. Similarly, the dual-port power supplies independently plug into the midplane through the rear opening of the 4 U chassis and straddle the two blades along the sides of the 4 U chassis. In particular, a rightside power supply sits right side up within the 4 U chassis, and a leftside power supply sits upside down within the 4 U chassis, thus enabling the manufacturer to connect both dual-port power supplies to the midplane while maintaining a single dual-port power supply design for the 4 U chassis. One power cord to each dual port power supply plugs into the rear face of the power supply through an IEC-C14 appliance coupler mounted on each power supply. Additionally, each pair of fans plugs into the midplane through a front opening of the 4 U chassis.

During operation, the midplane carries DC power supply signals from the two dual-port power supplies to the three pairs of fans and to the two blades (i.e., a first port of each dual-port power supply outputs power supply signals to one blade and a second port of each dual-port power supply outputs power supply signals to the other blade). The power for both the fans and the blades is diode-OR'd or shared to support backup of each other in the event of one DC power supply failing. Each blade of the 4 U enclosure typically includes two microprocessors and performs data storage operations. For example, each blade stores data into and retrieves data from an adjacent array of disk drives on behalf of one or more external host computers. The three pairs of fans pass air over the blades in a shared configuration to thermally maintain the blades within a controlled temperature range.

SUMMARY OF THE INVENTION

Apparatus includes a chassis assembly, a computing device configured to connect to a housing of the chassis assembly, and a line cord supplying power to the chassis assembly. The line cord has a first portion external to the chassis assembly and a second portion internal to the chassis assembly. The second portion has a shielding member that is in conductive contact with the housing to provide electromagnetic interference (EMI) shielding for the chassis assembly.

One or more embodiments of the invention may provide one or more of the following advantages.

An enclosure can be provided with effective EMI filtering without excessive impact on or risk to safety compliance and other equipment characteristics.

Other advantages and features will become apparent from the following description, including the drawings, and from the claims.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION

As described below, a simple, low cost, high current feed through capacitor filter/line cord technique is provided. For modern electronic equipment to meet the conducted radiated radio frequency interference (RFI) regulatory limits on AC power input line cords, input filtering is usually required. In the case of high speed computer equipment with switching mode power supplies inside, the interference source is widespread and typically contained in a metallic chassis. The filter is best located at the AC power entry point of the chassis. By use of the technique, at least some of the benefits of a feed through capacitor can be achieved in a new and different way. In short, a fully safety certified shielded line cord cable is used to achieve the benefits of an effective feed through capacitor while delivering the AC power input to such a chassis level product.

Conventionally, a feed through style "Y" capacitor is typically part of the filter solution, and is typically placed at the entry wall of the filter solution. Small size, low cost, and good filter performance from low to high frequencies on the AC cord are key attributes of this type of conventional capacitor. Since the conventional capacitor is on the AC cord, all parts need to be rugged and capable of handling large current surges and voltage transients up to several kilovolts, and accordingly are expected to be certified to meet safety standards. With such a conventional solution come difficulties with respect to encapsulation, potting, exit/entry wiring points, creepage, and safety spacing, collectively requiring significant development time and resources to address all safety standards worldwide, including testing and certification for compliance.

By contrast, use of the technique described herein helps eliminate the need for the inline feed through capacitors as separate devices needed for the filter solution and combines both the line cord and the feed through capacitor part of the filter into one component. Use of the technique also helps eliminate the connections required for separate devices and reduces or eliminates the risks of failing to comply with safety standards that are inherent in the use of conventional custom feed through capacitors. In general, use of the technique helps to save development time, reduces cost, and inherently helps to provide a more reliable AC power input implementation.

For example, the technique may be used as described below in a redundant computing apparatus includes a 1 U chassis (i.e., a chassis assembly with a 1 U form factor for efficient use of vertical space) and a particular configuration of components within the 1 U chassis.

Figure 1:
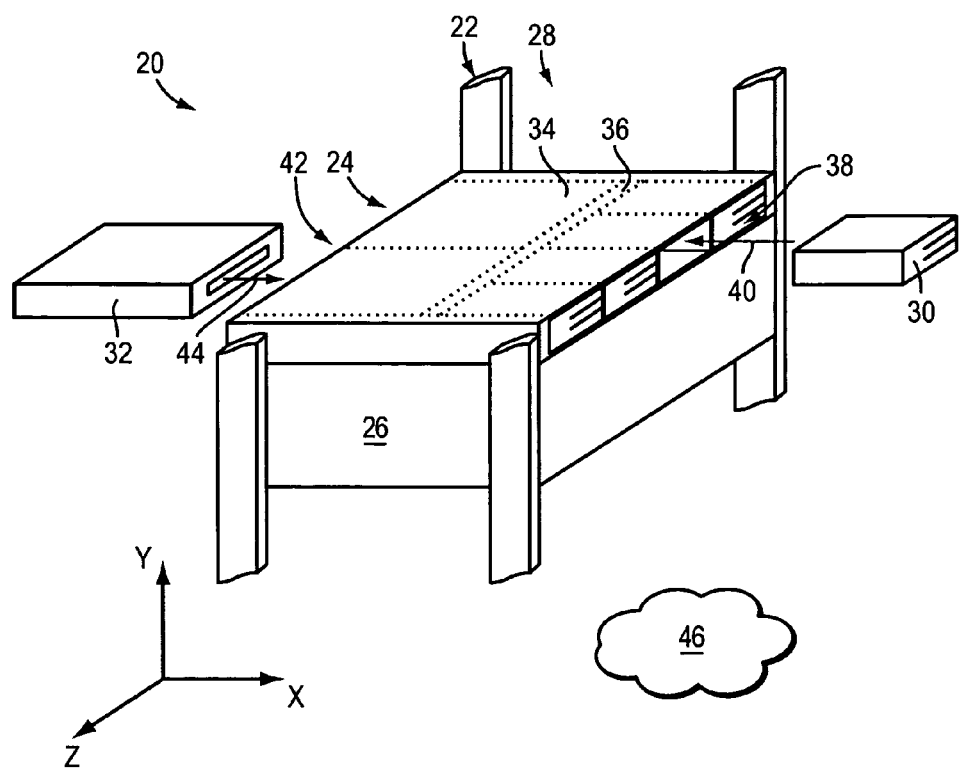
FIG. 1 is a perspective view of a rack system having an improved apparatus.

FIG. 1 shows a perspective view of a rack mount data storage system 20 having a standard electronic equipment rack 22 (e.g., cutaway portions of vertical rails for a standard 19-inch cabinet are shown for illustration purposes), a disk drive control apparatus 24 and an array of disk drives 26. The disk drive control apparatus 24 includes a chassis assembly 28, a set of power supply/blower assemblies 30 (i.e., one or more power supply/blower assemblies 30) and a set of computing devices 32 (i.e., one or more computing devices 32). The chassis assembly 28 is configured to (i) mount to the electronic equipment rack 22 and (ii) consume substantially 1 U of space in a particular direction (e.g., the Y-direction). The rack 22 is capable of supporting additional rack-mount components above and/or below the components 24, 26 (e.g., additional apparatus 24, more disk drives 26, network adapters, etc.).

As further shown in FIG. 1, the chassis assembly 28 includes a housing 34 and a midplane 36 disposed within the housing 34 (the location of the midplane 36 is illustrated by dashed lines along the Z-axis in FIG. 1). Each power supply/blower assembly 30 is configured to independently connect to the midplane 36 of the chassis assembly 28 through a front 38 of the housing 34 in a field replaceable manner (also see the arrow 40). That is, each power supply/blower assembly 30 is considered to be a field replaceable unit (FRU) because it is packaged in a modularized manner easy connection and disconnection from the midplane 36 when simply sliding toward or away from the midplane 36. Similarly, each computing device 32 is configured to independently connect to the midplane 36 of the chassis assembly 28 through a back or rear 42 of the housing 34 in a field replaceable manner (also see the arrow 44).

By way of example only, the array of disk drives 26 has a height of substantially 3 U's, and the disk drive control apparatus 24 mounts to the equipment rack 22 above the array of disk drives 26. During operation, the set of computing devices 32 obtains power and cooling from the set of power supply/blower assemblies 30, and accesses the array of disk drives 26 (i.e., moves data into and out of the array of disk drives 26) on behalf of a set of external host computers (shown generally in FIG. 1 by the reference numeral 46).

Figure 2:
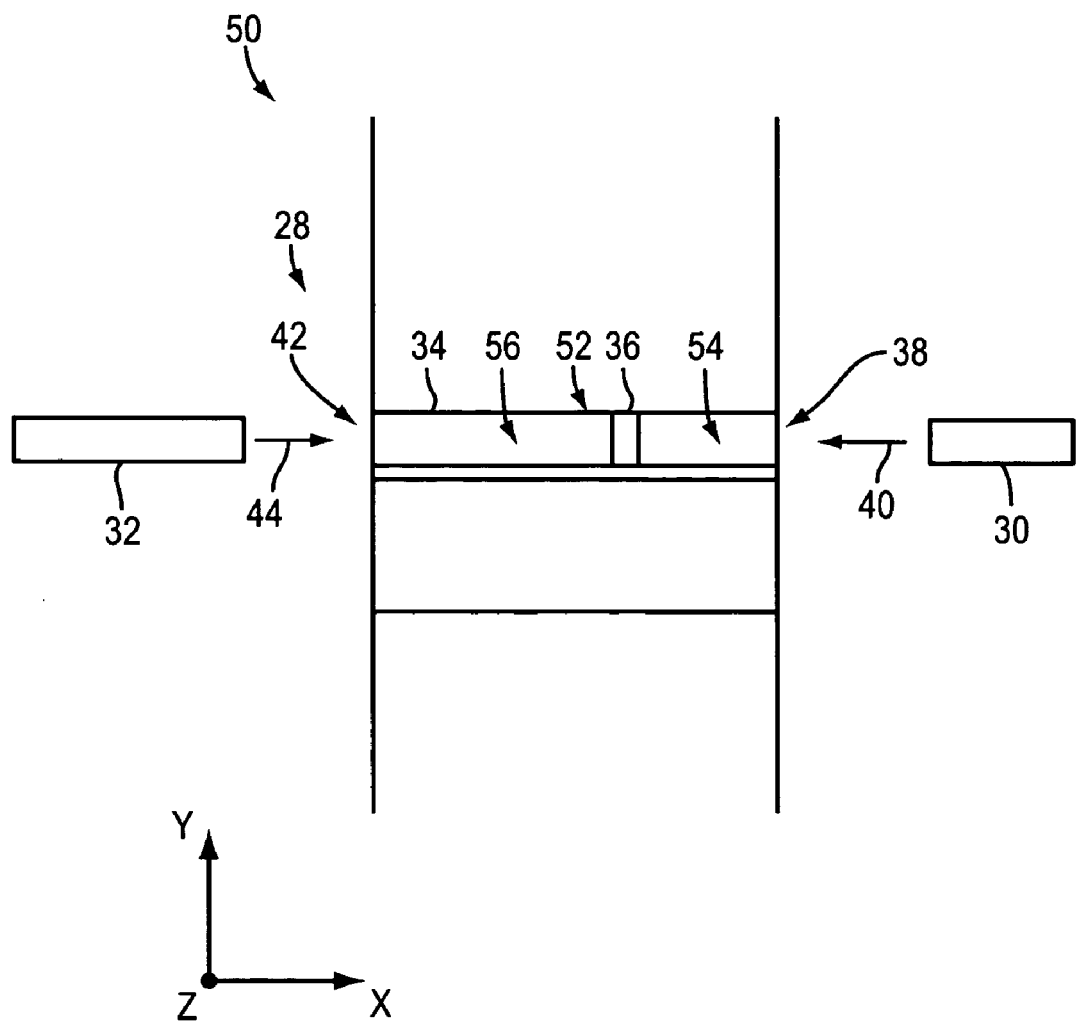
FIGS. 2, 5 are side views of the rack mount system of FIG. 1.

FIG. 2 is a cross sectional side view 50 of the rack mount data storage system 20. The midplane 36 divides a space 52 within the housing 34 into a front region 54 and a rear region 56. Each power supply/blower assembly 30 is capable of connecting to the midplane 36 (also see the arrow 40) and disconnecting from the midplane 36 through the front opening 38 in a hot swappable manner (i.e., while all other components connected to the midplane 36 have access to live electric signals).

Similarly, each computing device 32 is capable of connecting to the midplane 36 (also see the arrow 44) and disconnecting from the midplane 36 through the rear opening 42 of the 1 U chassis assembly 28 in a hot swappable manner.

Figure 3:
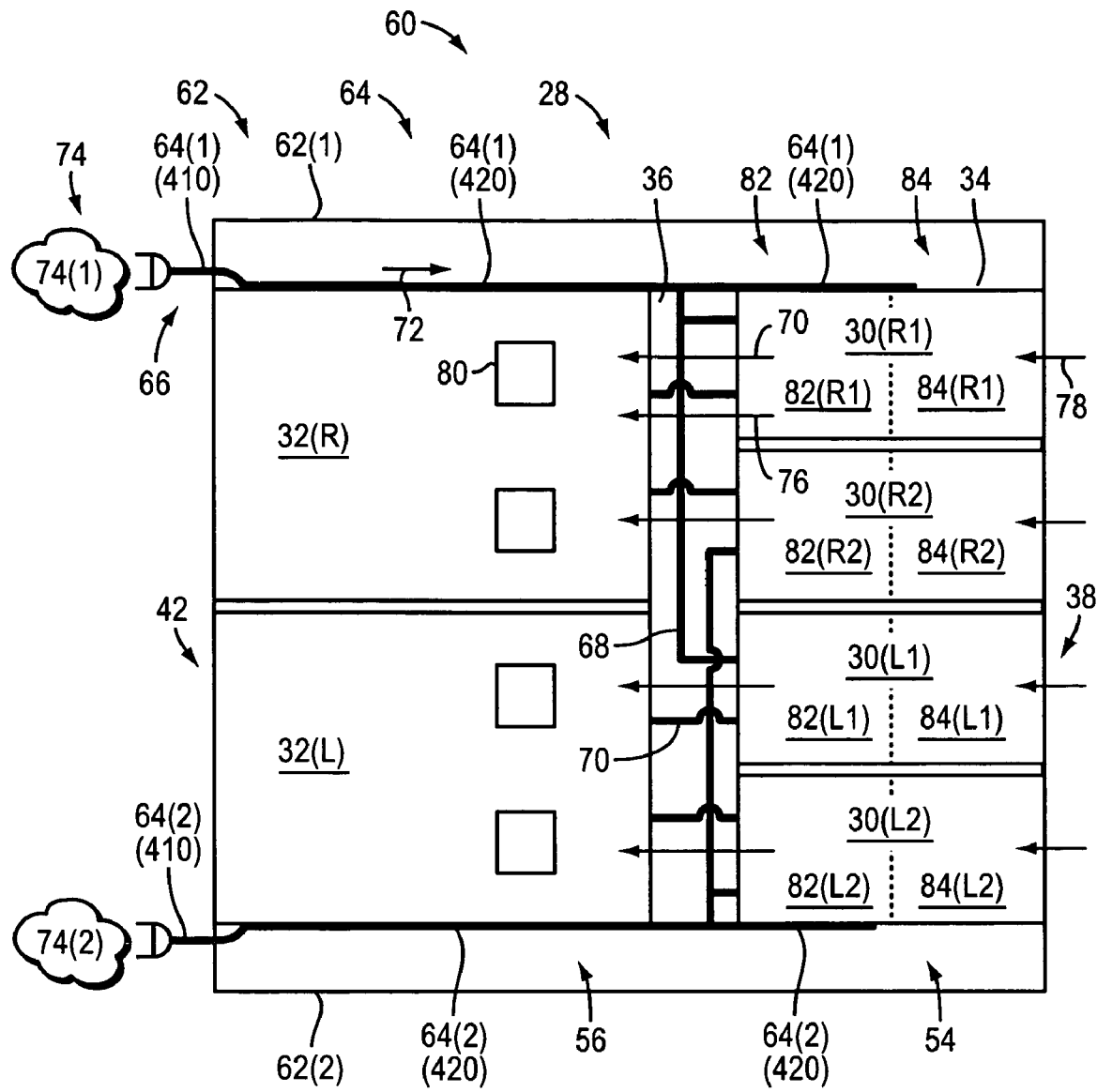
FIG. 3 is a top view of the improved apparatus of the rack mount system of FIG. 1.
Figure 3:
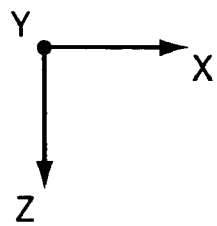

FIG. 3 is a top view 60 of the disk drive control apparatus 24 of the system 20. As shown in FIG. 3, the chassis assembly 28 further includes a set of rails 62 and a set of power supply cables 64. The rails 62 are configured to fasten the housing 34 to the electronic equipment rack 22 (FIG. 1), i.e., one rail 62(1) mounts the housing 34 to the righthand side of the rack 22 and another rail 62(2) mounts the housing 34 to the lefthand side of the rack 22. Further, as described below, the rails 62 respectively carry the power supply cables 64 in a manner that keeps the power supply cables 64 in conductive contact with housing 34 as well as clear of the rear opening 42.

The above-described arrangement of the midplane 36 and cables 64 which connect to the side edges of the midplane 36 allows the cables 64 to avoid hindering air flow through the housing 34. That is, there are no IEC-C14 appliance couplers required as part of the system 20.

Furthermore, the midplane 36 provides a low profile which does not substantially obstruct airflow through the housing 34. Rather, the midplane 36 provides abundant clearance between the front region 54 and the back region 56 of the housing 34 (also see FIG. 2).

It should be understood that the power supplies 82 of the power supply/blower assemblies 30 receive power from multiple external power sources 74(1), 74(2) in an interleaved manner for enhanced fault tolerance. That is, the power supplies 82(R1), 82(L1) receive power through the power supply cable 64(1) within the rail 62(1) from the external power source 74(1). Similarly, the power supplies 82(R2), 82(L2) receive power through the power supply cable 64(2) within the rail 62(2) from the external power source 74(2). Accordingly, if one of the external power sources 74(1), 74(2) were to fail or if one of the power supply cords 64 were to fail, both computing devices 32 would continue to receive power for maximum availability.

Figure 4:
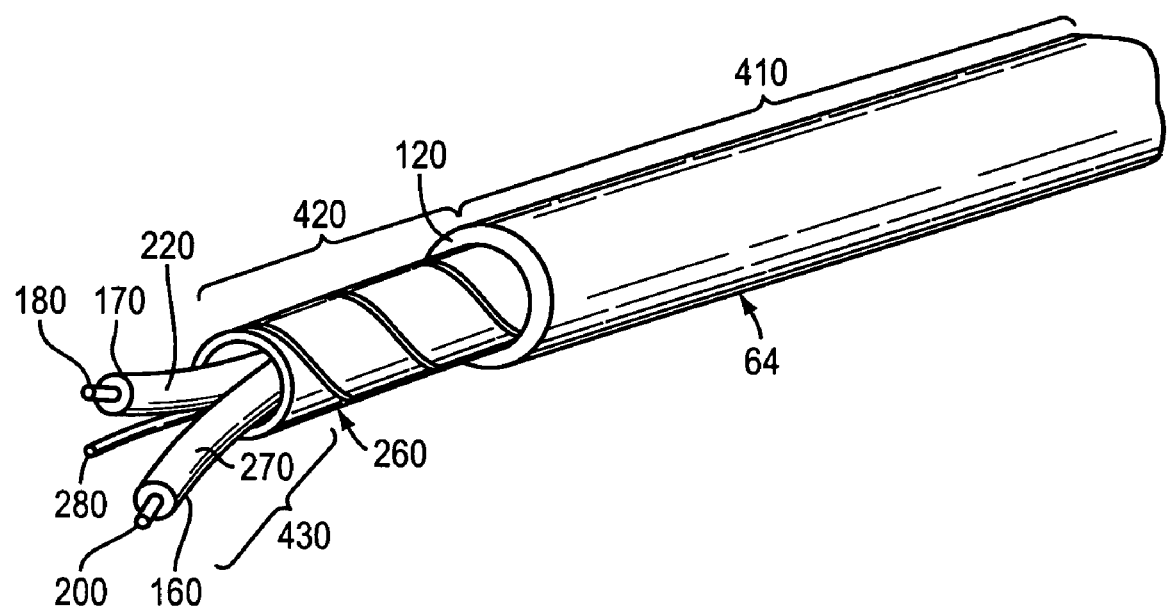
FIG. 4 is a perspective view of aspects of a line cord of the improved apparatus of FIG. 1.

FIG. 4 illustrates aspects of an example embodiment representing at least one of the power supply cables 64. Very generally the example embodiment includes a cable circuit including one or more conductors surrounded by an elongated shielding member. As described in more detail below, the shielding member may be a conductive braid such as a copper or aluminum braid (e.g., with an optical coverage of 90% or other high percentage), and/or may be foil based, and is wrapped circumferentially about the cable circuit forming a concentric, substantially closed shielding layer.

More specifically, in FIG. 4 power supply cable 64 is shown to have a first portion 410 with an outer insulation jacket 120 and a second portion 420 without the jacket 120. (Portion 430 is also shown with internal components exposed for illustration purposes.) FIG. 4 is not necessarily to scale. The core of cable 64 includes a pair of insulated conductors 140 and 160 (e.g., L conductor and N conductor) each including solid or stranded wires 180 and 200 covered in the conventional manner with insulating sleeves 220 and 240 respectively of a material such as rubber, plastic, etc. The conductors 140 and 160 represent a single cable circuit, are preferably helically twisted about each other, and are wrapped in an elongated shielding member 260. The conductors are preferably helically twisted about each other because this configuration affords better interference isolation characteristics and because a pair of conductors twisted about themselves retain their shape. A safety ground wire conductor 280 is also included. The shielding member 260 is wrapped circumferentially around the conductors 140, 160, 280 in a helical configuration forming a concentric, substantially closed shielding tube within which the conductors are encased.

In at least some applications, the power supply cable may have additional features, e.g., as described in U.S. Pat. No. 4,327,246. For example, the shielding member 260 may include a ribbon of insulating material fabricated from a suitable material such as polyethylene terephthalate resin, sold under the trademark "Mylar," tetrafluoroethylene polymer, sold under the trademark "Teflon," vinyl polyethylene, etc. A pair of foil strips which are fabricated from any of the conducting materials such as copper, aluminum or silver may be arranged in a parallel relationship with the ribbon, and may each be bonded to an opposite side of the ribbon, each having an outer elongated edge generally in alignment with opposite elongated edges of the ribbon. The foil strips may have a width slightly larger than half of the width of the insulating ribbon so that the inner elongated edges of the foil strips overlap. The exposed surfaces of the ribbon may be coated with a heat sensitive sealing material which bonds the ribbon to itself but not to the outer jacket or the inner core of the electric cable.

Conductor 280 is for safety grounding, and in at least some cases must satisfy UL/IEC regulatory requirements regarding current capacity. In such cases, shielding member 260 is preferably a conductive braid since foil strips typically do not have sufficient cross-section to provide a high current path that would qualify as a safety grounding conductor.

Conductor 280 may be fabricated from an uninsulated wire conductor preferably of solid material, and may be used to provide an easier means to terminate the ground of the cable. Further, having wire 280 in contact with shielding member 260 along the length of the cable 64 may reduce the resistance of the cable ground.

If shielding member 260 includes foil strips, the foil strips may be spirally wrapped around the conductors 140 and 160 as shown in FIG. 4, such that at higher frequencies each of the metallic strips acts as an inductance, each turn of the foil strips being equivalent to a turn of a coil. To prevent the spirally wound foil strips from acting as an inductance and allowing leakage of unwanted electrical signals, the foil strips may terminate against themselves along the length of the shielding member, thus shorting each turn of the coil and eliminating the inductive effect.

Figure 5:
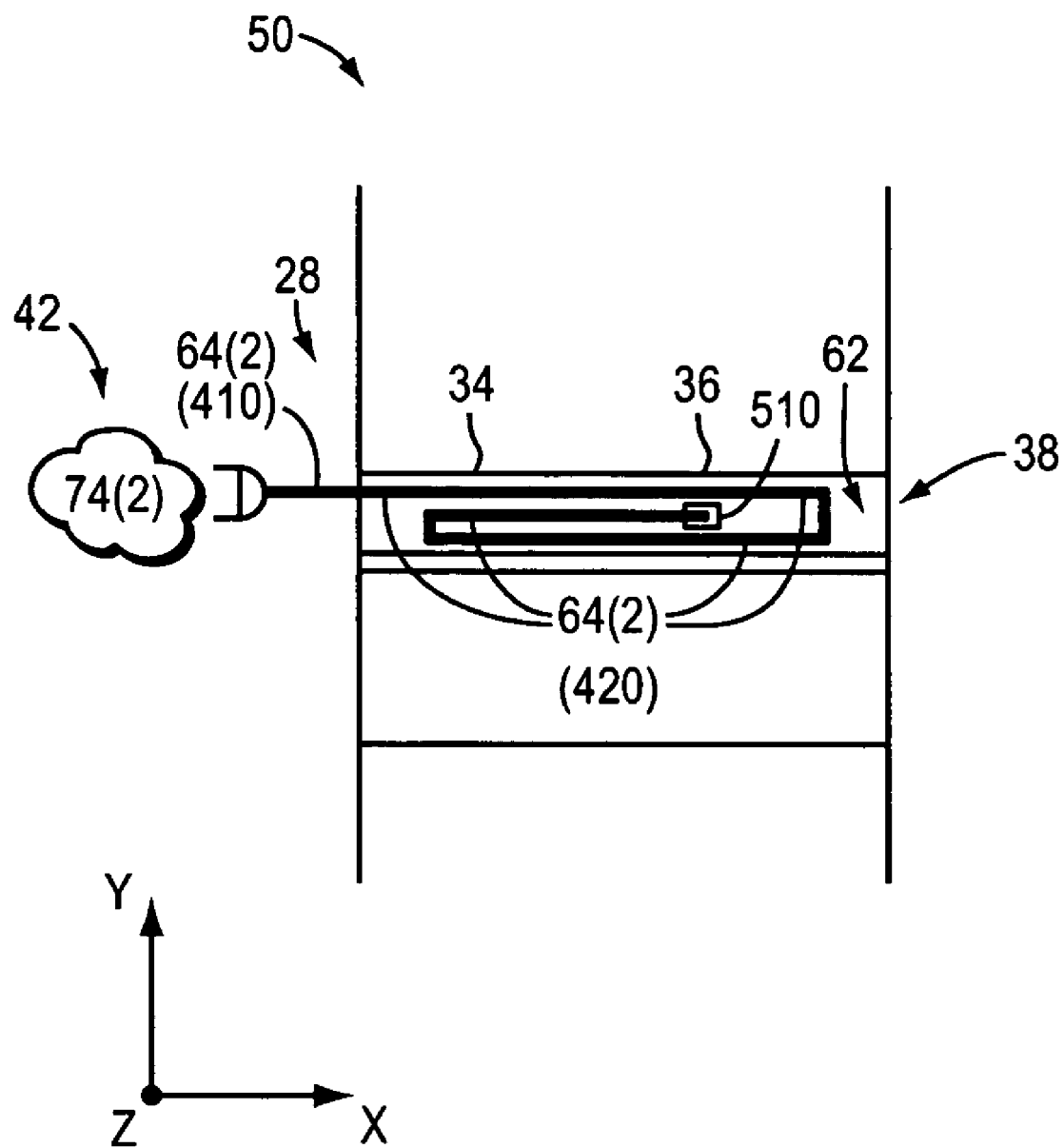

FIG. 5 is side view of the rack mount data storage system 20 illustrated in FIG. 2, showing an example placement of power cord 64(2), with portion 410 being outside the enclosure, and portion 420 (particularly shielding member 260) being conductively in contact with housing 34 and entering opening 510. Portion 420 may have a length longer or shorter than as shown in FIG. 5 and/or may loop around more or less than shown in FIG. 5.

In at least some implementations, portion 420 is as long as possible (e.g., 6-9 feet), limited only by the amount of space available inside rail 62. For example, each rail 62(1), 62(2) may include 0.4 inches of space on each side, such that each cord 64(1), 64(2) can be arranged as described above. However, in some applications one such rail may be sufficient, and the same technique applies.

In particular, cord 64 may have strain relief applied at its entrance to the enclosure at one end (portion 410), and on the inside of the enclosure cord 64 has foil or braid 260 exposed (portion 420) for conductive contact with housing 34.

Portion 420 may be maintained in conductive attachment or contact with housing 34 in any of multiple ways, such as mechanically by deterministic pressure to make sure portion 420 touches housing 34, or by glue or a sleeve or stuffing that holds portion 420 against housing 34. In at least one implementation, a wall where portion 420 contacts housing 34 inside rail 62 is the defined EMI wall for the enclosure.

The more surface area of housing 34 that is in contact with portion 420, the more filtering capacitance is created as a result. In particular, within portion 420, air may serve as the dielectric, such that portion 420 has a particular amount of capacitance per unit of length. For example, with sufficient length, portion 420 may include a capacitance of 2000 pF or more, which may approximate the amount of capacitance that would be supplied by a feed through capacitor. The technique has a scaling aspect in that larger equipment tends to have more EMI but also tends to have additional housing surface area available for conductive contact with portion 420, such that portion 420 can have more length and thus additional capacitance with which to filter out the EMI.

The technique may be used in combination with other filtering techniques, such as capacitor components and/or ferrite beads. The technique may be used for AC or DC power cords and/or for signal wires that may otherwise have EMI problems.

In at least one implementation, since portion 420 is in conductive contact with housing 34, all or part of the rest of rail 62 need not be made of conductive metal and instead may be made of another material such as plastic.

The technique also simplifies the enclosure such that the enclosure already requires a power line cord, which can be supplied already compliant with safety standards, such that there is little or no adverse affect on the enclosure's robustness. In particular, in at least some implementations, since portion 420 is on the inside of the enclosure, safety compliance is not affected by the lack of outer insulation jacket 120 on portion 420. In some cases, the lack of outer insulation jacket 120 on portion 420 may be at least partially offset by an insulator used to press portion 420 against housing 34.

In addition, the technique, by relying on industry standard cabling, helps avoid creating a sole source situation for manufacturing.

It should be understood that although certain preferred embodiments of the present invention have been illustrated and described, various modifications, alternatives and equivalents thereof will become apparent to those skilled in the art and, accordingly, the scope of the present invention should be defined only by the appended claims and equivalents thereof.

Various features of the invention are set forth in the following claims.

We claim:

1. An apparatus, comprising: a chassis assembly including a housing; a computing device configured to connect to the housing; and a line cord supplying power to the chassis assembly, the line cord having a first portion external to the chassis assembly and a second portion internal to the chassis assembly, the second portion having a shielding member being in conductive contact with the housing to provide electromagnetic interference (EMI) shielding for the chassis assembly, wherein the shielding member circumferentially wraps the second portion in a helical, tubular configuration, wherein a second line cord supplying power to the chassis assembly, the second line cord having a third portion external to the chassis assembly and a fourth portion internal to the chassis assembly, the fourth portion having a shielding member being in conductive contact with the housing to provide electromagnetic interference (EMI) shielding for the chassis assembly.

2. An apparatus, comprising: a chassis assembly including a housing and a midplane disposed within the housing; a power supply/blower assembly configured to connect to the midplane of the chassis assembly through a front of the housing in a field replaceable manner; a computing device configured to connect to the midplane of the chassis assembly through a back of the housing in a field replaceable manner; and a line cord supplying power to the power supply/blower assembly, the line cord having a shielding member being in conductive contact with the housing to provide electromagnetic interference (EMI) shielding for the chassis assembly, wherein the shielding member circumferentially wraps a portion of the line cord in a helical, tubular configuration, wherein a second line cord supplying power to the chassis assembly, the second line cord having a third portion external to the chassis assembly and a fourth portion internal to the chassis assembly, the fourth portion having a shielding member being in conductive contact with the housing to provide electromagnetic interference (EMI) shielding for the chassis assembly.

3. The apparatus of claim 1, wherein the first portion has an insulating member as the first portion's outermost layer.

4. The apparatus of claim 1, wherein at least some of the line cord is located at the AC power entry point of the chassis assembly.

5. The apparatus of claim 1, wherein the line cord includes a fully safety certified shielded line cord cable.

6. The apparatus of claim 1, wherein the line cord serves as a feed through capacitor filter.

7. The apparatus of claim 1, wherein the line cord comprises a cable circuit comprising an insulated conductor at least partially surrounded by the shielding member.

8. The apparatus of claim 1, wherein the shielding member is foil based and is wrapped circumferentially about an insulated conductor of the line cord forming a concentric, substantially closed shielding layer for the line cord.

9. The apparatus of claim 1, wherein the first portion has an outer insulation jacket 120 that terminates does not extend over the second portion.

10. The apparatus of claim 1, wherein the line cord comprises a pair of insulated conductors and a safety ground wire conductor.

11. The apparatus of claim 1, wherein the shielding member comprises a conductive braid.

12. The apparatus of claim 1, wherein the line cord comprises a ground wire in contact with the shielding member.

13. The apparatus of claim 1, wherein the line cord enters an opening of the housing.

14. The apparatus of claim 1, wherein the second portion is disposed in at least a partial loop on the housing.

15. The apparatus of claim 1, wherein the second portion is maintained in conductive contact with the housing mechanically by deterministic pressure.

16. The apparatus of claim 1, wherein the second portion is maintained in conductive contact with the housing by a sleeve.

17. The apparatus of claim 1, wherein the second portion is maintained in conductive contact with the housing at a defined EMI wall of the chassis assembly.

18. The apparatus of claim 1, wherein the second portion has a filtering capacitance of at least 2000 pF.

* * * * *